US007759138B2

(12) United States Patent
Beaulieu et al.

(10) Patent No.: US 7,759,138 B2
(45) Date of Patent: Jul. 20, 2010

(54) SILICON MICROCHANNEL PLATE DEVICES WITH SMOOTH PORES AND PRECISE DIMENSIONS

(75) Inventors: David Beaulieu, Groton, MA (US); Neal T. Sullivan, Lunenburg, MA (US)

(73) Assignee: Arradiance, Inc., Sudbury, MA (US)

( * ) Notice: Subject to any disclaimer, the term of this patent is extended or adjusted under 35 U.S.C. 154(b) by 0 days.

(21) Appl. No.: 12/234,641

(22) Filed: Sep. 20, 2008

(65) Prior Publication Data

US 2010/0075445 A1 Mar. 25, 2010

(51) Int. Cl.
*H01L 21/00* (2006.01)
*H01L 21/311* (2006.01)
*H01L 21/31* (2006.01)
*B31D 3/00* (2006.01)
*G02B 6/10* (2006.01)
*C25D 5/48* (2006.01)

(52) U.S. Cl. ......................... 438/20; 438/696; 438/770; 257/E21.216; 257/E21.285; 216/56; 385/132; 205/223; 977/888

(58) Field of Classification Search .................. 438/20, 438/696, 770; 257/E21.216; 216/56; 385/132
See application file for complete search history.

(56) References Cited

U.S. PATENT DOCUMENTS

| | | | | |
|---|---|---|---|---|
| 4,780,395 | A | 10/1988 | Saito et al. | |
| 4,853,020 | A * | 8/1989 | Sink | 65/393 |
| 4,912,314 | A | 3/1990 | Sink | |
| 5,143,577 | A * | 9/1992 | Haas et al. | 216/24 |
| 5,205,902 | A * | 4/1993 | Horton et al. | 216/56 |
| 5,378,960 | A | 1/1995 | Tasker et al. | |
| 5,544,772 | A * | 8/1996 | Soave et al. | 216/2 |
| 5,568,013 | A | 10/1996 | Then et al. | |
| 5,569,355 | A | 10/1996 | Then et al. | |
| 5,726,076 | A | 3/1998 | Tasker et al. | |
| 5,997,713 | A * | 12/1999 | Beetz et al. | 205/124 |
| 6,103,599 | A * | 8/2000 | Henley et al. | 438/459 |
| 6,522,061 | B1 | 2/2003 | Lockwood | |
| 6,850,683 | B2 * | 2/2005 | Lee et al. | 385/129 |

(Continued)

OTHER PUBLICATIONS

"Notification of Transmittal of the International Search Report and the Written Opinion of the International Searching Authority, or the Declaration" for PCT/US09/035017, Korean Intellectual Property Office, Jan. 11, 2010, 14 pages, Seo-gu, Republic of Korea.

(Continued)

*Primary Examiner*—Walter L Lindsay, Jr.
*Assistant Examiner*—Ron Pompey
(74) *Attorney, Agent, or Firm*—Kurt Rauschenbach; Rauschenbach Patent Law Group, LLP

(57) ABSTRACT

A method of fabricating a microchannel plate includes forming a plurality of pores in a silicon substrate. The plurality of pores is oxidized, thereby consuming silicon at surfaces of the plurality of pores and forming a silicon dioxide layer over the plurality of pores. At least a portion of the silicon dioxide layer is stripped, which reduces a surface roughness of the plurality of pores. A semiconducting layer can be deposited onto the surface of the silicon dioxide layer. The semiconducting layer is then oxidized, thereby consuming at least some of the polysilicon or amorphous silicon layer and forming an insulating layer. Resistive and secondary electron emissive layers are then deposited on the insulating layer by atomic layer deposition.

12 Claims, 3 Drawing Sheets

U.S. PATENT DOCUMENTS

| | | | | |
|---|---|---|---|---|
| 7,081,384 | B2 * | 7/2006 | Birner et al. | 438/248 |
| 2005/0199510 | A1 * | 9/2005 | Kochergin et al. | 205/640 |

OTHER PUBLICATIONS

Elam, Jeffrey W., et al., Atomic Layer Deposition for the Conformal Coating of Nanoporous Materials, Journal of Nanomaterials, 2006, pp. 1-5, vol. 2006, Hindawi Publishing Corporation.

Beetz, Charles, P. et al., Silicon-Micromachined Microchannel Plates, Nuclear Instruments and Methods in Physics Research, 2000, pp. 443-451, vol. 442, Elsevier.

Bogaerts, W. et al., Large-Scale Production Techniques for Photonic Nanostructures , Gent University, pp. 1-12, Belgium.

Ezoe, Yuichiro, MEMS Open the Way to Ultra-Lightweight and Low-Cost X-Ray Optics, The International Society for Optical Engineering, pp. 1-3.

Kaaret, P., et al., X-Ray Focusing Using Microchannel Plates, Applied Optics, Dec. 1, 1992, pp. 7339-7343, vol. 31, No. 34, Optical Society of America.

Kaaret, Philip, Development of Microchannel Plate X-Ray Optics, Columbia Astrophysics Laboratory, Jul. 1, 1993-Jun. 30, 1994, pp. 1-13, Columbia University, New York, USA.

Lee, Kevin K., et al., Fabrication of Ultralow-loss Si/SiO2 Waveguider by Roughness Reduction, Optics Letters, Dec. 1, 2001, pp. 1888-1890,vol. 26, No. 23, Optical Society of America.

Snider, G. L., et al., High Aspect Ratio Dry Etching for Microchannel Plates, J. Vac Sci. Technol. B., Nov./Dec. 1994, pp. 3327-3331, vol. 12, No. 6, American Vacuum Society.

Tasker, G. W., et al., Microfabrication of Channel Electron Multipliers, SPIE, pp. 58-70, vol. 2640.

Sze, S. M., VLSI Technology, 1983, p. 111ff, McGraw Hill.

* cited by examiner

SILICON MICROCHANNEL PLATE DEVICES WITH SMOOTH PORES AND PRECISE DIMENSIONS

FEDERAL RESEARCH STATEMENT

This invention was made with Government support under Grant Number HR0011-05-9-0001 awarded by the Defense Advanced Research Projects Agency (DARPA). The Government has certain rights in this invention.

The section headings used herein are for organizational purpose only and should not to be construed as limiting the subject matter described in the present application.

BACKGROUND OF THE INVENTION

Microchannel plates (MCPs) are used to detect very low fluxes (down to single event counting) of ions, electrons, photons, neutral atoms, and neutrons. For example, microchannel plates are commonly used as electron multipliers in image intensifying devices. A microchannel plate is a slab of high resistance material having a plurality of tiny tubes or slots, which are known as pores or microchannels, extending through the slab. The microchannels are parallel to each other and may be positioned at a small angle to the surface. The microchannels are usually densely packed. A high resistance layer and a layer having high secondary electron emission efficiency are formed on the inner surface of each of the plurality of channels so that the layer functions as a continuous dynode. A conductive coating is deposited on the top and bottom surfaces of the slab comprising the microchannel plate.

In operation, an accelerating voltage is applied between the conductive coatings on the top and bottom surfaces of the microchannel plate. The accelerating voltage establishes a potential gradient between the opposite ends of each of the plurality of channels. Ions and/or electrons traveling in the plurality of channels are accelerated. These ions and electrons collide against the high resistance outer layer of the pore having high secondary electron emission efficiency, thereby producing secondary electrons. The secondary electrons are accelerated and undergo multiple collisions with the emissive layer. Consequently, electrons are multiplied inside each of the plurality of channels. The electrons eventually leave the channel at the output end of each of the plurality of channels. The electrons can be detected or can be used to form images on an electron sensitive screen, such as a phosphor screen or on a variety of analog and digital readouts.

BRIEF DESCRIPTION OF THE DRAWINGS

The invention, in accordance with preferred and exemplary embodiments, together with further advantages thereof, is more particularly described in the following detailed description, taken in conjunction with the accompanying drawings. The drawings are not necessarily to scale, emphasis instead generally being placed upon illustrating principles of the invention.

DETAILED DESCRIPTION

Figure 1:
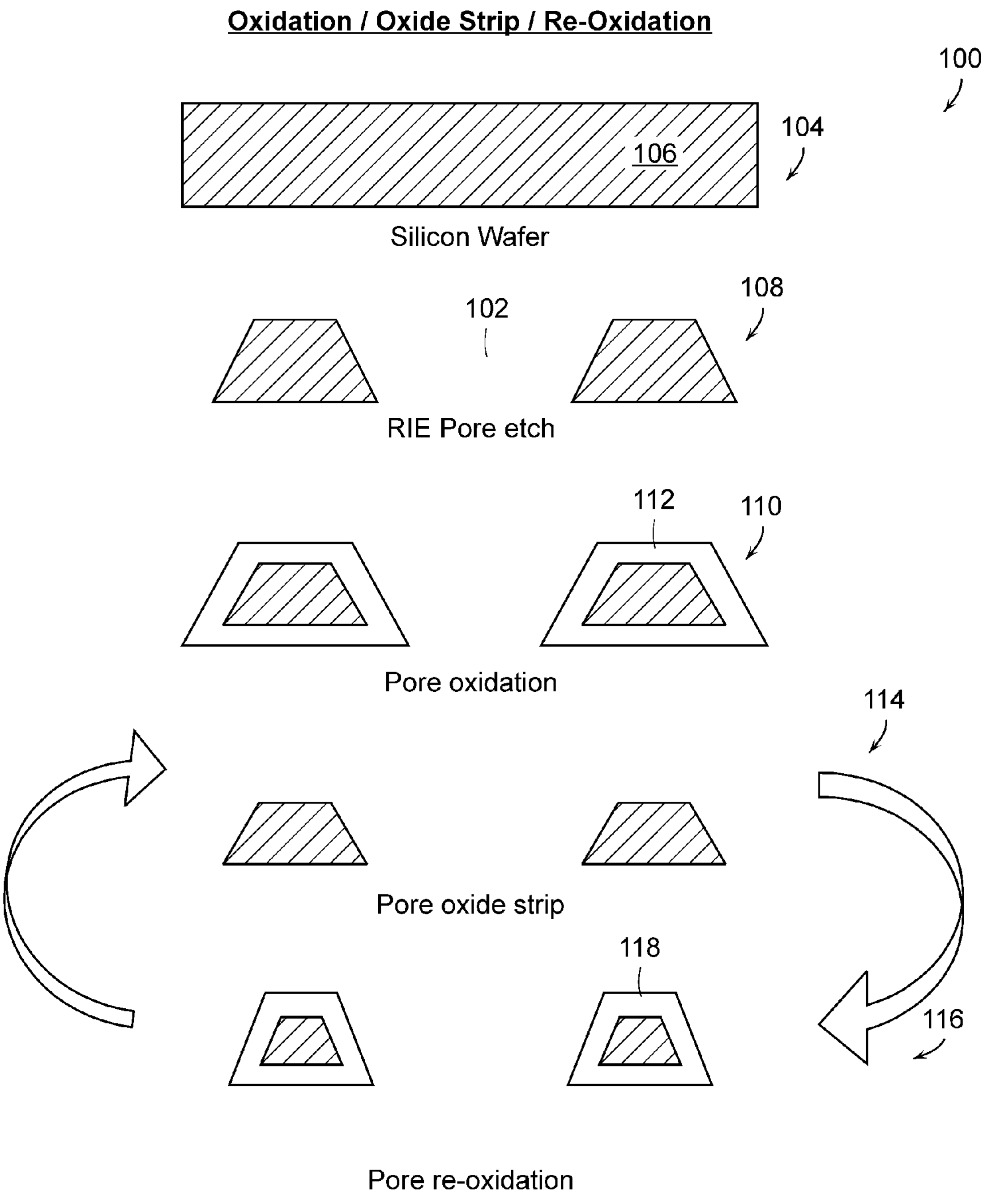
FIG. 1 illustrates a process sequence for fabricating a plurality of microchannel plate pores in a silicon substrate using an oxidation/re-oxidation reaction according to one embodiment of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It should be understood that the individual steps of the methods of the present invention may be performed in any order and/or simultaneously as long as the invention remains operable. Furthermore, it should be understood that the apparatus and methods of the present invention can include any number or all of the described embodiments as long as the invention remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein.

Microchannel plates are typically manufactured using a glass multifiber draw (GMD) process. In the GMD process, individual composite fibers, consisting of an etchable core glass and an alkali lead silicate cladding glass, are formed by drawdown of a rod-in-tube perform, which is well known in the art. The rod-in-tube preforms are then packed together in a hexagonal or rectangular array. This array is then redrawn into hexagonal/rectangular multifiber bundles, which are stacked together and fused within a glass envelope to form a solid billet. The solid billet is then sliced, typically at a small angle of approximately 4°-15° from the normal to the fiber axes.

Individual slices are then polished into a thin plate. The soluble core glass is removed by a chemical etchant, resulting in an array of microscopic channels with channel densities of $10^5$-$10^7$/cm$^2$. Further chemical treatments, followed by a hydrogen reduction process, produces the resistive and emissive surface properties required for electron multiplication within the microscopic channels. Metal electrodes are thereafter deposited on the faces of the wafer to complete the manufacture of the microchannel plate. An alternative manufacturing technique performs the draw process on the clad glass only, without core glass. This technique eliminates the need to etch the latter on the final stages.

The hydrogen reduction step is critical for the operation of prior art MCP devices and determines both the resistive and the emissive properties of the continuous dynode. Lead cations in the near-surface region of the continuous glass dynode are chemically reduced, in a hydrogen atmosphere at temperatures of 350°-650° C., from the $Pb^2$ state to lower oxidation states with $H_2O$ as a reaction by-product. This process results in the development of significant electrical conductivity within a submicron distance to the surface of the reduced lead silicate glass (RLSG) dynode.

The physical mechanism responsible for the conductivity is not well understood but is believed to be due to either an electron hopping mechanism via localized electronic states in the band gap or a tunneling mechanism between discontinuous islands of metallic lead within the RLSG film. The observed electrical conductivity is ohmic in nature and is similar to the conductivity of a metal due to the observed material properties. The term "ohmic" means that the electrical conductivity follows Ohm's law where the resistance is substantially constant as a function of applied voltage.

Furthermore, the Temperature Coefficient of Resistance (TCR) of the RLSG is typically less than about 1% per degree C. The resistance is insensitive to applied external electric field and is stable with applied bias. These properties are observed in common metals. The presence of ohmic conduction is essential for stable MCP device operation. The resulting RLSG dynode exhibits an electrically conductive surface with a nominal sheet resistance of $10^{14}$ Ω/sq. It is known in the art that the electrical characteristics of RLSG dynodes represent a complex function of the chemical and thermal history of the glass surface as determined by the details of its manufacture.

During hydrogen reduction, other high-temperature processes, such as diffusion and evaporation of mobile chemical species in the lead silicate glass (e.g., alkali alkaline earth, and lead atoms), act to modify the chemistry and structure of RLSG dynodes. Materials analysis of the near-surface region the microchannel surface of MCPs has indicated that RLSG dynodes have a two-layer structure including a resistive layer and an emissive layer.

The RLSG manufacturing technology is mature and results in the fabrication of relatively inexpensive and high performance devices. However, the RLSG manufacturing technology has certain undesirable limitations. For example, both electrical and electron emissive properties of RLSG dynodes are quite sensitive to the chemical and thermal history of the glass surface comprising the dynode. Therefore, reproducible performance characteristics for RLSG MCPs critically depend upon stringent control over complex, time-consuming, and labor-intensive manufacturing operations. In addition, the ability to enhance or tailor the characteristics of RLSG MCPs is constrained by the limited choices of materials which are compatible with the present manufacturing technology. Resulting performance limitations include: gain amplitude and stability, count rate capabilities, maximum operating temperature, background noise, reproducibility, size, shape, and heat dissipation in high-current devices.

The manufacture of microchannel plates according to the GMD process is dictated by the mechanical requirements of the substrate as well, further restricting the choice of materials available. The multifiber drawdown technique requires that the core and cladding starting materials both be glasses with carefully chosen temperature-viscosity and thermal expansion properties. The fused billet must have properties suitable for wafering and finishing. The core material must be preferentially etched over the cladding with very high selectivity. In addition, the clad material must ultimately exhibit sufficient surface conductivity and secondary electron emission properties to function as a continuous dynode for electron multiplication. This set of constraints greatly limits the range of materials suitable for manufacturing MCPs with the present technology. See also "Microchannel Plate Detectors," Joseph Wiza, Nuclear Instruments and Methods, Vol. 162, 1979, pages 587-601 for a detailed description of fabricating microchannel plates from glass fibers. Numerous types of substrate materials can achieve the mechanical requirements and be used for the microchannel plate.

Recently, silicon has been used as a substrate for microchannel plates. See, for example, U.S. Pat. No. 6,522,061B1 to Lockwood, which is assigned to the present assignee. Silicon microchannel plates have several advantages compared with glass microchannel plates. Silicon microchannel plates can be more precisely fabricated because the channels can be lithographically defined rather than manually stacked like glass microchannel plates. Silicon processing techniques, which are very highly developed, can be applied to fabricating such microchannel plates. Also, silicon substrates are much more process compatible with other materials and can withstand high temperature processing, unlike glass MCPs which melt at much lower temperatures.

In addition, silicon microchannel devices can be easily integrated with other devices. For example, a silicon microchannel plate can be easily integrated with various types of other electronic and optical devices, such as photodectors, MEMS, and various types of integrated electrical and optical circuits. Previous difficulties with silicon MCPs have to do with successful application of resistive and emissive films which form the continuous dynode and are necessary for the electron cascade. One skilled in the art will appreciate that the substrate material can be any one of numerous other types of insulating substrate materials.

Also, U.S. Pat. No. 5,086,248 entitled "Microchannel Electron Multipliers" and U.S. Pat. No. 5,205,902 entitled "Method of Manufacturing Microchannel Electron Multipliers," which are both to Horton et al., describe fabrication of silicon MCP devices using dry (or reactive ion) etch techniques. One problem with using dry or reactive ion etch processing techniques is that there is a relatively high residual surface roughness on the pore sidewall following the etch process. Problems with using dry or reactive ion etch processing techniques are described in "High Aspect Ratio Dry Etching for Microchannel Plates," Snider et al. J. Vac. Sci. Technol. B12(6), November/December 1994. This paper attributes significant sidewall roughness to the action of ions during the etch process. Substrate temperature was investigated as a potential solution but did not describe the sidewall roughness issue.

Roughness of the pore sidewall directly results in a nonuniformity of both secondary electron emission and surface charging, both of which have a significant impact on device gain and timing performance. Furthermore, for X-ray focusing microchannel plate detectors, the reflectivity of X-rays is highly dependent on the roughness of the pore walls. It is thought that surface roughness of the channel plates can be the prime factor limiting the efficiency and resolution of the focusing optics. Finally, surface roughness increases the surface area available for adsorption of contaminants, which are later released during device operation. This increase in the surface area available for adsorption of contaminants affects both MCP lifetime as well as downstream device lifetime of devices, such as image intensifying devices.

The present invention relates to microchannel plate devices with continuous dynodes containing separate resistive and emissive films which may exhibit enhanced secondary electron emission. While most known microchannel plates are fabricated from lead glass material systems, the microchannel plate devices of the present invention are not limited to lead glass material systems. It should be understood that the methods of forming a resistive and secondary electron emissive layer by atomic layer deposition according to the present invention can be used with any type of microchannel plate. In particular, the microchannel plate devices of the present invention may be formed of semiconducting or insulating materials. For example, silicon can be used as a substrate for microchannel plates as described in U.S. Pat. No. 6,522,061B1 to Lockwood, which is assigned to the present assignee.

FIG. 1 illustrates a process sequence 100 for fabricating a plurality of microchannel plate pores in a silicon substrate using an oxidation/re-oxidation reaction according to one embodiment of the present invention. FIG. 1 illustrates the fabrication of a single pore 102 to more clearly illustrate the invention. However, it should be understood that typical microchannel plates include a very large number of pores, which may be on the order of several million pores.

In a first step 104, a silicon substrate 106 is provided. Microchannel plates fabricated from silicon substrates have numerous advantages compared with microchannel plates fabricated from lead glass material systems as described herein.

In a second step 108, a plurality of pores 102 are formed by selectively etching the silicon substrate 106. In some embodiments, the silicon substrate 106 is thinned to a reduced thickness that still provides sufficient mechanical strength for further processing and handling. For example, the silicon substrate can be mechanically lapped and polished to reduce the thickness of the substrate 106 either before or after the etch step. In many embodiments, the pores are lithographically defined so that the area of the plurality of pores 102 is exposed for etching.

The pores 102 are etched using a high aspect-ratio etching process. In some embodiments, the plurality of pores 102 is etched using reactive ion etching. In other embodiments, the plurality of pores 102 are etched using another type of high aspect-ratio etching process, such as reactive ion beam etching (RIBE), ion milling and electrochemical etching. The resulting etched sidewalls may not be perfectly straight because of the very high aspect-ratio of the pores 102. The etched sidewalls can be wider at the top of the substrate 106, closest to the entrance of the etch material, because the top of the substrate 106 is exposed to the etch material for a longer period of time.

In a third step 110, the plurality of pores 102 are oxidized so as to grow a silicon dioxide layer 112. The silicon dioxide layer 112 consumes some of the silicon during the growth process which reduces the dimensions of the plurality of pores 102 as the oxide grows. Silicon is consumed at a relatively high rate at locations that have relatively rough surface features caused by the directional etching. Consequently, the silicon dioxide growth process tends to smooth the surface of the plurality of pores 102.

In a fourth step 114, the silicon dioxide layer 112 formed in the third step 110 is stripped. Removing the silicon dioxide layer 112 exposes the plurality of etched silicon pores 102. The surface of the plurality of exposed pores 102 has significantly less defects and is significantly smoother compared with the surface of the plurality of pores 102 etched in the second step 108. In addition, the dimensions of the plurality of pores 102 are now larger compared with the dimensions of the pores etched in the second step 108 because some silicon material which was consumed while growing the silicon dioxide layer 112 in the third step 110 is now removed.

In a fifth step 116, the silicon dioxide layer 112 is re-oxidized on the silicon surface that was exposed in the fourth step 114. That is, a new silicon dioxide layer 118 is grown on the silicon surface exposed in the fourth step 114. The new silicon dioxide layer 118 consumes additional quantities of the silicon during the growth process which again reduces the dimensions of the plurality of pores 102. The silicon re-oxidation process also tends to further smooth the surface of the pores 102.

In various embodiments, the fourth and fifth steps 114, 116 are repeated a plurality of times. The number of times that the fourth and fifth steps 114, 116 are repeated is determined by the desired smoothness of the sidewalls forming the plurality of pores 102 and by the desired dimensions of the plurality of pores 102. Each time the fourth and fifth steps 114, 116 are repeated, the sidewalls forming the plurality of pores 102 will get gradually smoother and the dimensions of the plurality of pores 102 will get gradually larger.

Figure 2:
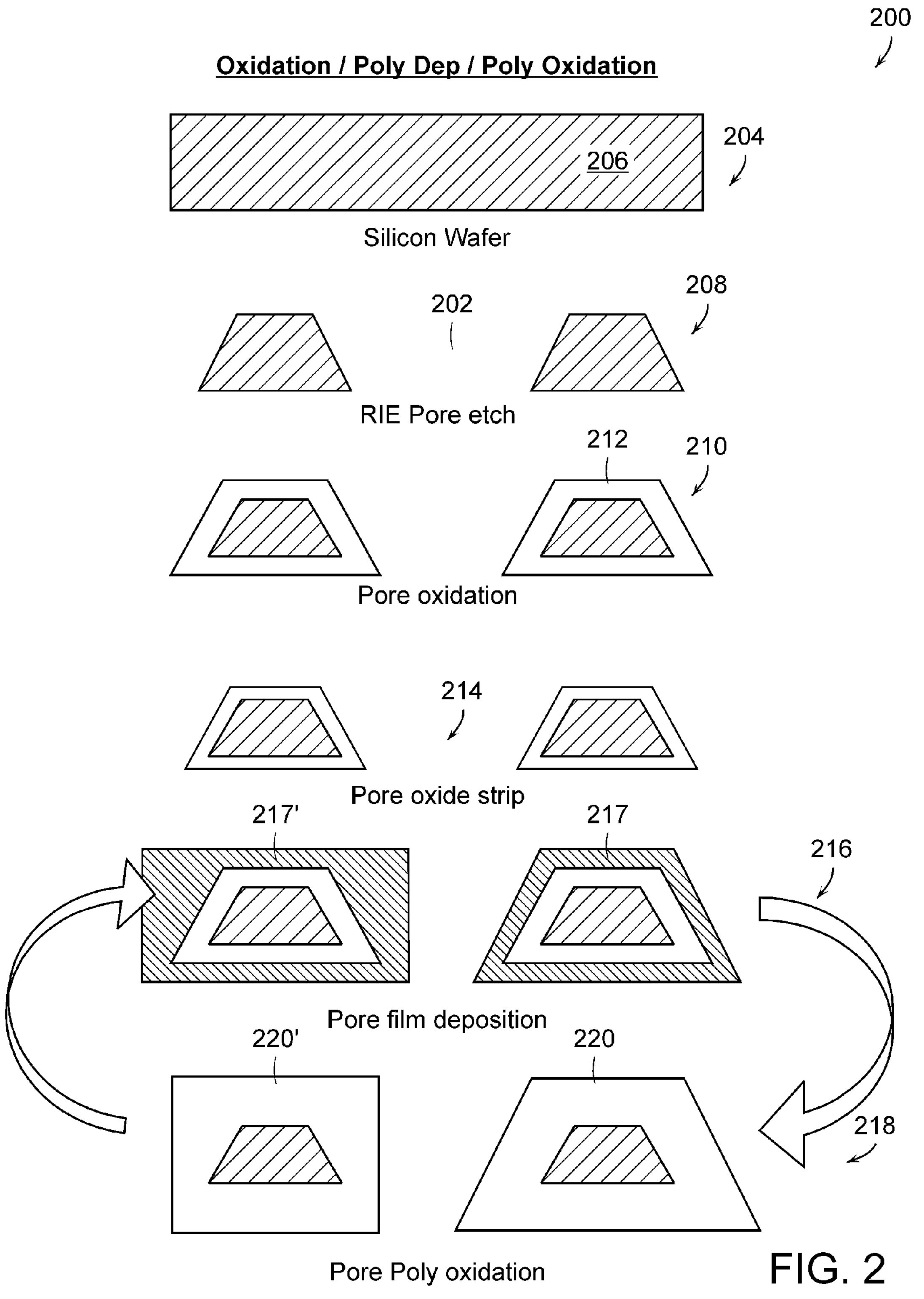
FIG. 2 illustrates a process sequence for fabricating a plurality of microchannel plate pores in a silicon substrate using an oxidation/silicon deposition/re-oxidation reaction according to another embodiment of the present invention.

FIG. 2 illustrates a process sequence 200 for fabricating a plurality of microchannel plate pores in a silicon substrate using an oxidation/silicon deposition/re-oxidation reaction according to one embodiment of the present invention. FIG. 2 illustrates the fabrication of a single pore 202 to more clearly illustrate the invention. However, it should be understood that typical microchannel plates include a very large number of pores, which may be on the order of several million pores.

In a first step 204, a silicon substrate 206 is provided. In a second step 208, the plurality of pores 202 are formed by selectively etching the silicon substrate. In some embodiments, the silicon substrate 206 is thinned to a reduced thickness that still provides sufficient mechanical strength for further processing and handling. For example, the silicon substrate can be mechanically lapped and polished to reduce the thickness of the substrate 206 either before or after the etch step.

In many embodiments, the pores are lithographically defined so that the area of the plurality of pores 202 is exposed for etching. The pores 202 are etched using a high aspect-ratio etching process. In some embodiments, the plurality of pores 202 is etched using reactive ion etching. In other embodiments, the plurality of pores 202 are etched using another type of high aspect-ratio etching process, such as reactive ion beam etching (RIBE), ion milling or electrochemical etching. The resulting etched sidewalls may not be perfectly straight because of the very high aspect-ratio of the pores 202. The etched sidewalls can be wider at the top of the substrate 206, closest to the entrance of the etch material, because the top of the substrate 206 is exposed to the etch material for a longer period of time.

In a third step 210, the plurality of pores 202 are oxidized so as to grow a silicon dioxide layer 212. The silicon dioxide layer 212 consumes some of the silicon substrate 206 during the growth process which reduces the dimensions of the plurality of pores 202 as the oxide grows. Silicon is consumed at a relatively high rate at locations that have relatively rough surface features caused by the directional etching. Consequently, the silicon dioxide growth process tends to smooth the surface of the plurality of pores 202.

In a fourth step 214, the silicon dioxide layer 212 formed in the third step 210 is stripped. This layer may be fully or partially removed as shown in the fourth step 214. Removing the silicon dioxide layer 212 exposes the plurality of etched silicon pores 202. The surface of the plurality of exposed pores 202 has significantly less defects and is significantly smoother compared with the surface of the plurality of pores 202 etched in the second step 208. In addition, the dimensions of the plurality of pores 202 are now larger compared with the dimensions of the pores etched in the second step 208 because some silicon material which was consumed while growing the silicon dioxide layer 212 in the third step 210 is now removed.

In a fifth step 216, a polysilicon or amorphous silicon layer 217, 217' is deposited using Chemical Vapor Deposition (CVD) onto the surface of the plurality of pores 202. The fifth step 216 is drawn for illustrative purposes and carried through steps 218 and is described further in connection with FIG. 3. A conformal film 217 is shown and a film whose deposition parameters have been adjusted to result in vertical sidewalls 217'. For example, in some processes, the polysilicon or amorphous silicon layer 217, 217' is about 1.5 microns thick. Also, in some embodiments, the polysilicon or amorphous silicon layer 217, 217' is doped. For example, the polysilicon or amorphous silicon layer 217, 217' can be doped with a dopant selected from the group III and V elements of the periodic table, such as boron or phosphorous that increases oxidation efficiency during the following oxidation process steps.

The dopant can also be chosen to improve the insulating properties of the polysilicon or amorphous silicon. Suitable dopants include nitrogen and halogens—HCl. Process parameters for the Chemical Vapor Deposition (CVD) of Polysilicon can be adjusted so that the film thickness along the pore varies in such a way that the film thickness compensates for the deviation from vertical of the etched sidewalls, resulting in a sidewall that is more nearly vertical than the as-etched sidewall. Examples of such process variables include deposition temperature, pressure, reactant concentration, and the presence of dopants. Such process variables control the rate of surface reactions.

The degree of conformality of coverage for the deposited film as shown by the difference in coverage between films 217 and 217' is directly related to the ability of reactants or reactive intermediates to adsorb on the surface and rapidly migrate along the surface before reacting. Rapid migration of reactants and reactive intermediates results in a more uniform surface concentration, which is independent of surface topography. Therefore, rapid migration of reactants and reactive intermediates can result in a completely uniform and conformal film thickness.

The deposition rate of the film is proportional to the arrival angle of the gas molecules if there is no significant surface migration. The film thickness as a function of the arrival angle $\phi=\arctan(w/d)$ and the width of the channel opening can be calculated, where "w" is the opening width and "d" is the distance from the top surface when the mean free path of the gas is much larger than the step dimension (i.e. a vertical surface).

One aspect of the methods of the present invention is that the thickness of the deposited film as a function of depth in the pore can be precisely controlled to achieve any desired thickness profile as a function of depth by controlling the surface migration of reactants and reactive intermediates. In one embodiment of the invention, the surface migration of reactants and reactive intermediates can be chosen so that the thickness profile as a function of depth compensates for any sidewall sloping that occurred during etching so as to achieve pores that are essentially vertical.

In a sixth step 218, the polysilicon or amorphous silicon layer 217, 217' formed in the fifth step 216 is oxidized. The polysilicon or amorphous silicon layer 217, 217' is relatively smooth compared with the surface of the plurality of pores 202 etched in the second step 208. The oxidation of the polysilicon or amorphous silicon layer 217, 217' consumes at least some of the polysilicon or amorphous silicon layer 217, 217'. In the embodiment shown in FIG. 2, the polysilicon or amorphous silicon oxidation consumes all of the polysilicon or amorphous silicon layer 217, 217' to form an oxidized layer 220, 220'.

In an alternative embodiment, the fifth step 216 can include depositing a silicon dioxide or other insulating film layer, such as $Si_3N_4$, SiC, or $Al_2O_3$, on the surface of the plurality of pores 202. In this embodiment, it would not be necessary to perform the oxidization in the sixth step 218, which would reduce process complexity.

In various embodiments, the fourth, fifth, and sixth steps 214, 216, 218 are repeated a plurality of times. The number of times that the fourth step 214 is repeated is determined by the desired smoothness of the sidewalls forming the plurality of pores 202. The number of times that the fifth and sixth steps 216, 218 are repeated is determined by the desired dimensions of the plurality of pores 202. Each time the fourth step 214 is repeated, the sidewalls forming the plurality of pores 202 will get gradually smoother. However, in this process sequence, the polysilicon or amorphous silicon deposition in the fifth step 216 provides additional material that decreases the dimensions of the plurality of pores 202. This additional material is available to be consumed during the polysilicon or amorphous silicon oxidation step 218.

Therefore, in the process sequence 200 shown in FIG. 2, the process engineer can precisely control the dimensions of the plurality of pores 202. In various embodiments, the dimensions of the plurality of pores 202 can be increased, decreased, or can remain substantially the same as the dimensions of the plurality of pores 202 that are originally etched in the second step 208. Thus, one feature of the present invention is that the process of fabricating a plurality of pores 202 according to the present invention can precisely control the critical dimensions of the plurality of pores 202 or any other structure.

In particular, the process sequence 200 illustrated in FIG. 2 allows the process engineer to reduce the critical dimensions of the plurality of pores 202 after the pores are initially formed in the silicon substrate 206. For example, a plurality of 300 micron long pores have been fabricated according to the process sequence 200 illustrated in FIG. 2 where the smallest diameter of the plurality of pores 202 after the selective etching of the silicon substrate 206 in the second step 208 was about 15 microns. The number of polysilicon or amorphous silicon deposition and polysilicon or amorphous silicon oxidation steps was chosen to narrow the smallest diameter of the plurality of pores 202 after performing the desired number of deposition and oxidation steps to less than 8 microns.

Figure 3:
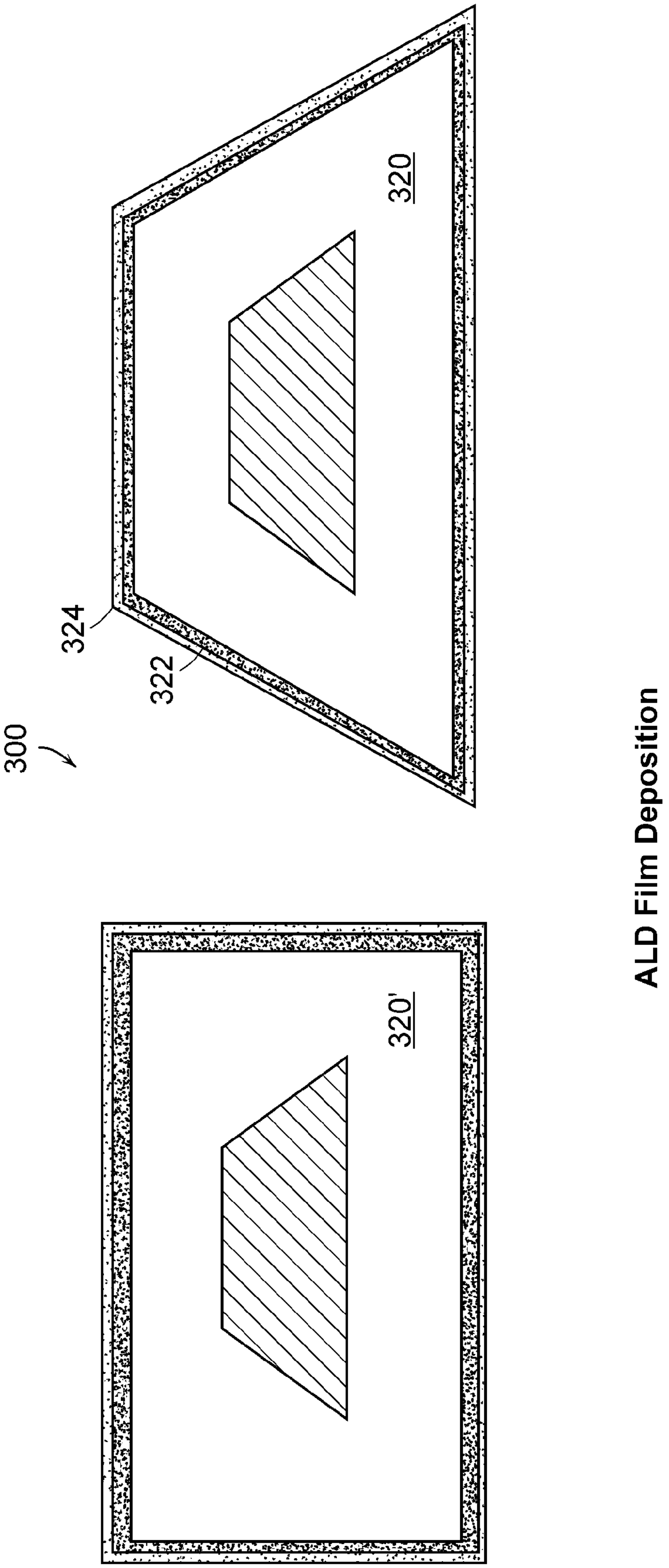
FIG. 3 illustrates the process sequence for depositing the resistive and secondary electron emissive layers onto the substrates resulting from the process sequences described in connection with FIG. 1 and FIG. 2

FIG. 3 details the common processing that follows the process flows outlined in FIG. 1 and FIG. 2, where a resistive layer 322 and a secondary electron emissive layer 324 are deposited onto the surfaces 320, 320' of the plurality of pores 302. The resistive layer 322 has sufficient resistivity to support a current that is adequate to replace emitted electrons and to allow for the establishment of an accelerating electric field for the emitted electrons. The secondary electron emissive layer 324 is a layer that emits secondary electrons with high efficiency. One skilled in the art will appreciate that numerous types of resistive and secondary electron emissive layers can be used. For example, in various embodiments, the resistive layer 322 can be a zinc-doped, copper oxide nanolaminate with $Al_2O_3$ and the secondary electron emissive layer 324 can be a layer of at least one of $Al_2O_3$, MgO, $Cu_2O$, $SnO_2$, $BaF_2$, $Rb_3Sn$, BeO, and various forms of thin film diamond. One advantage of depositing the separate resistive 322 and secondary electron emissive 324 layers is that the properties of the individual layers can be optimized independent of the other process parameters.

The performance of a microchannel plate is determined by the properties of the resistive and emissive layers that form the continuous dynodes in the channels. These properties include the pore length and pore diameter dimensions that are determined by the substrate and by the etching process.

The continuous dynodes must have emissive and conductive surface properties that provide at least three different functions. First, the continuous dynodes must have emissive surface properties desirable for efficient electron multiplication. Second, the continuous dynodes must have conductive properties that allow the emissive layer to support a current adequate to replace emitted electrons. Third, the continuous dynodes must have conductive properties that allow for the establishment of an accelerating electric field for the emitted electrons.

In prior art MCP devices, the performance of these three functions, emitting secondary electrons, replacing emitted electrons, and establishing an accelerating electric field for the emitted electrons, cannot typically be simultaneously maximized. In fact, most known microchannel plates are fabricated to optimize the resistance of the emissive layer rather than to optimize the secondary electron emission.

In one aspect of the present invention, a microchannel plate according to the present invention includes resistive and a secondary electron emission layers that can be optimized independently of other parameters to achieve a various performance goals, such as a specific operating current or dynamic range and a high secondary electron emission efficiency. These layers can also be optimized separately to achieve high or maximum lifetime. Such a microchannel plate has significantly improved microchannel plate gain and lifetime performance compared with known microchannel plate devices.

In some embodiments of the present invention, the resistive 322 and secondary electron emissive layer 324 are deposited by Atomic Layer Deposition (ALD). Atomic layer deposition has been shown to be effective in producing highly uniform, pinhole-free films having thickness that are as thin as a few Angstroms. Films deposited by ALD have relatively high quality and high film integrity compared with other methods, such as physical vapor deposition (PVD), thermal evaporation, and chemical vapor deposition (CVD).

Atomic Layer Deposition (ALD) is a gas phase chemical process used to create extremely thin coatings. Atomic layer deposition is a variation of CVD that uses a self-limiting reaction. The term "self-limiting reaction" is defined herein to mean a reaction that limits itself in some way. For example, a self-limiting reaction can limit itself by terminating after a reactant is completely consumed by the reaction.

Atomic layer deposition reactions typically use two chemicals, which are sometimes called precursor chemicals. These precursor chemicals react with a surface one-at-a-time in a sequential manner. A thin film is deposited by repeatedly exposing the precursors to a growth surface. For example, ALD can be performed by sequentially combining precursor gas A and precursor gas B in a process chamber. In a first step, a gas source injects a pulse of precursor gas A molecules into the process chamber. After a short exposure time, a monolayer of precursor gas A molecules deposits on the surface of the substrate. The process chamber is then purged with an inert gas. During the first step, precursor gas A molecules stick to the surface of the substrate in a relatively uniform and conformal manner. The monolayer of precursor gas A molecules covers the exposed areas including the high aspect-ratio pores 102 (FIG. 1) in a relatively conformal manner with relatively high uniformity and minimal shadowing.

Process parameters, such as chamber pressure, surface temperature, gas injection time, and gas flow rate can be selected so that only one monolayer remains stable on the surface of the substrate at any given time. In addition, the process parameters can be selected for a particular sticking coefficient. Plasma pre-treatment can also be used to control the sticking coefficient.

In a second step, another gas source briefly injects precursor gas B molecules into the process chamber. A reaction between the injected precursor gas B molecules and the precursor gas A molecules that are stuck to the substrate surface occurs which forms a monolayer of the desired film that is typically about 1-2 Angstroms thick. This reaction is self-limiting because the reaction terminates after all the precursor gas A molecules are consumed in the reaction. The process chamber is then purged with an inert gas.

The monolayer of the desired film covers the exposed areas including vias, steps and surface structures in a relatively conformal manner with relatively high uniformity and minimal shadowing. The precursor gas A molecules and the precursor gas B molecules are then cycled sequentially until a film having the desired total film thickness is deposited on the substrate. Cycling the precursor gas A molecules and the precursor gas B molecules prevents reactions from occurring in the gaseous phase, thereby generating a more controlled reaction.

In various embodiments, the atomic layer deposition process for depositing the resistive 322 and secondary electron emissive layer 324 can be designed to optimize the resistive 322 secondary electron emissive 324 layers independently of other parameters to achieve a targeted operating current or dynamic range or a high secondary electron emission efficiency. The resistive 322 and secondary electron emission 324 layers can also be optimized independently of other parameters to achieve high or maximum lifetime. The improvement in lifetime results at least in part from the ability of the resistive and emissive films to prevent ion emission into the channel. The resistive and emissive films can be fabricated according to the present invention to provide a substantial barrier to ion emission into the channel by depositing the films with sufficient purity so as to minimize the ion content. Such films can also be fabricated to provide a barrier to ion migration from the substrate, which also limits the emission of ions and improves the lifetime. Such a microchannel plate can have significantly improved microchannel plate gain and lifetime performance compared with known microchannel plate devices.

EQUIVALENTS

While the present teachings are described in conjunction with various embodiments and examples, it is not intended that the present teachings be limited to such embodiments. On the contrary, the present teachings encompass various alternatives, modifications and equivalents, as will be appreciated by those of skill in the art, which may be made therein without departing from the spirit and scope of the invention.

What is claimed is:

1. A method of fabricating a silicon microchannel plate, the method comprising:

a. forming a plurality of pores in a silicon substrate;

b. oxidizing the plurality of pores, thereby consuming silicon at surfaces of the plurality of pores and forming a silicon dioxide layer over the plurality of pores;

c. stripping at least a portion of the silicon dioxide layer, thereby reducing a surface roughness of the plurality of pores;

d. depositing a film on a surface of the silicon dioxide layer; and e. depositing resistive and secondary electron emissive layers on the deposited film.

2. The method of claim 1 wherein the plurality of pores are formed by at least one of reactive ion etching, reactive ion beam etching, and electrochemical etching.

3. The method of claim 1 wherein the deposited film on the surface of the silicon dioxide layer comprises a semiconducting film which is thermally oxidized to produce an insulating film.

4. The method of claim 1 wherein the deposited film on the surface of the silicon dioxide layer comprises an oxide of at least one element selected from of the group consisting of Al, Si, Zr, Hf, Ta, and Ti.

5. The method of claim 1 wherein the deposited film on the surface of the silicon dioxide layer comprises a nitride of at least one element selected from of the group consisting of Al, Si, Zr, Hf, Ta, and Ti.

6. The method of claim 1 wherein the emissive layer comprises an oxide of at least one element selected from of the group consisting of Al, Si, Mg, Sn, Ba, Ca, Sr, Sc, Y, La, Zr, Hf, Ta, Ti, V, Cs, B, Nb, Be, and Cr.

7. The method of claim 1 wherein the emissive layer comprises a nitride of at least one element selected of the group consisting of Al, Si, Mg, Sn, Ba, Ca, Sr, Sc, Y, La, Zr, Hf, Ta, Ti, V, Cs, B, Nb, Be, and Cr.

8. The method of claim 1 wherein the depositing the resistive layer on the oxide layer by atomic layer deposition comprises adjusting process parameters to achieve a desired current that replaces emitted electrons during operation.

9. The method of claim 1 wherein the depositing the secondary electron emissive layers on the oxide layer by atomic layer deposition comprises adjusting process parameters to maximize secondary electron efficiency.

10. The method of claim 1 wherein the depositing the resistive and secondary electron emissive layers on the deposited film by atomic layer deposition comprises depositing resistive and secondary electron emissive layers that improve lifetime of the microchannel plate.

11. The method of claim 1 wherein the deposited film on the surface of the silicon dioxide layer is deposited to achieve a desired sidewall shape.

12. The method of claim 1 wherein the depositing the resistive and the secondary electron emissive layers on the film comprises depositing the resistive and the secondary electron emissive layers on the film by atomic layer deposition.

* * * * *